(12) United States Patent  
Kapusta, Jr. et al.

(10) Patent No.: US 8,008,962 B2
(45) Date of Patent: Aug. 30, 2011

(54) INTERFACE CIRCUIT FOR BRIDGING VOLTAGE DOMAINS

(75) Inventors: Ronald A. Kapusta, Jr., Waltham, MA (US); Katsu Nakamura, Andover, MA (US); Eitake Ibaragi, Saitma (JP)

(73) Assignee: Analog Devices, Inc., Norwood, MA (US)

( * ) Notice: Subject to any disclaimer, the term of this patent is extended or adjusted under 35 U.S.C. 154(b) by 17 days.

(21) Appl. No.: 12/467,437

(22) Filed: May 18, 2009

(65) Prior Publication Data

US 2010/0026359 A1 Feb. 4, 2010

Related U.S. Application Data

(60) Provisional application No. 61/085,710, filed on Aug. 1, 2008.

(51) Int. Cl.
*H03K 5/08* (2006.01)

(52) U.S. Cl. ............. 327/309; 327/333; 326/80; 361/56

(58) Field of Classification Search .............. 326/62–63, 326/80–81; 327/309, 333, 306; 361/56
See application file for complete search history.

(56) References Cited

U.S. PATENT DOCUMENTS

| 6,313,819 | B1 * | 11/2001 | Maekawa et al. | 345/92 |
| 7,619,594 | B2 * | 11/2009 | Hu | 345/76 |
| 2007/0188638 | A1 * | 8/2007 | Nakazawa et al. | 348/294 |

* cited by examiner

*Primary Examiner* — Dinh T. Le
(74) *Attorney, Agent, or Firm* — Kenyon & Kenyon LLP

(57) ABSTRACT

The invention is directed to an interface circuit for bridging voltage domains. The interface circuit receives an input signal, having a larger voltage domain, and safely provides the signal to an electronic device which has a smaller voltage domain. The interface circuit may include a transistor configured as a source follow so that an output of the transistor follows the input of the transistor. A blocking voltage may be provided at the input of the transistor to provide a voltage bias, blocking a range of input voltages to the transistor. The transistor may also have a blocking voltage at a drain terminal of the transistor, to block any output voltage above the blocking voltage.

10 Claims, 7 Drawing Sheets

INTERFACE CIRCUIT FOR BRIDGING VOLTAGE DOMAINS

BACKGROUND

As manufacturing techniques improve, electronic devices, such as micro-processors, application specific integrated circuits (ASIC's), and the like, use smaller and smaller voltage domains. Some electronic devices, for example, cannot tolerate a voltage input greater than 2.8V. However, as electronics devices get faster and smaller, the electronic devices may not be able to tolerate voltage inputs greater than 1.8V, 1.2V or even less.

Electronic devices can be damaged when the device receives an input with a voltage that exceeds the tolerance of the electronic device. However, there are instances where an electronic device with a smaller voltage domain may need to interface with another electronic device with a larger voltage domain or receive an input signal which may exceed the tolerance of the device. For example, an electronic device, which can tolerate voltages between 0V and +1.8V may need to receive a signal from another device which may have a much larger voltage range, for example, −7V to +15V.

Accordingly, there is a need for a method for handling large signals in a smaller domain to avoid damaging electronic circuits of the electronic device with the smaller voltage domain.

DETAILED DESCRIPTION

A bridging interface, in accordance with an embodiment of the present invention, may include a transistor receiving an input voltage and providing an output voltage, and a voltage source, proving a clipping voltage to a terminal of the transistor, preventing the output voltage of the transistor from rising above the clipping voltage. The bridging interface may further include a capacitor connected between the input voltage and a input terminal of the transistor and a blocking voltage source, connected between the capacitor and the input of the transistor, blocking a range of voltages input by the input voltage. Accordingly, by, preventing the output voltage of the transistor from rising above the clipping voltage and blocking a range of voltages input by the input voltage, the bridging interface may allow an electronic device to handle large signals in a smaller domain while avoiding damage to electronic circuits of the electronic device.

Figure 1:
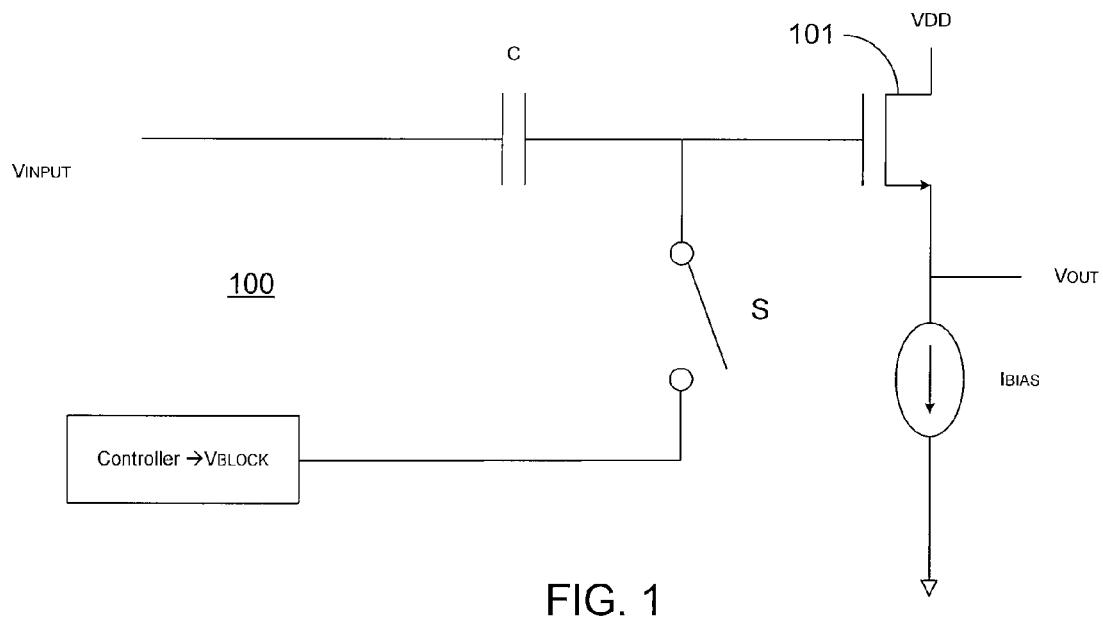
FIG. 1 illustrates an exemplary embodiment of a transistor with large-scale blocking characteristics.

An exemplary embodiment of a bridging interface 100 can be seen in FIG. 1. FIG. 1 illustrates a transistor 101, having an input capacitor C and a switch coupled to an input terminal of the transistor 101. A first voltage source (not shown) provides a voltage VDD at a terminal of the transistor 101, and a second voltage source (not shown) provides a blocking voltage Vblock coupled to the input terminal of the transistor 101 through the switch S. The transistor 101 receives an input voltage Vinput at the input terminal of the transistor 101, and provides an output voltage Vout at an output terminal of the transistor 101.

FIG. 1, and the following discussion, illustrates the first embodiment using a NMOS transistor configured as a source follower, however, one of ordinary skill in the art would recognize that other circuits, for example, a PMOS source follower or a bipolar emitter follower, could also be used.

In FIG. 1, the first voltage source provides the voltage VDD at the drain terminal of transistor 101, which provides an upper limit for the output voltage Vout of the transistor 101. That is, the voltage VDD present at the drain of the NMOS transistor 101 functions as a clipping voltage and blocks any output voltage Vout that would exceed the voltage VDD. The current source Ibias establishes a predetermined current at the source terminal of NMOS transistor 101 to set an appropriate operating point for the source follower. The current source can be implemented, for example, with transistors. The blocking voltage Vblock is connected to a gate terminal of transistor 101 through the switch S. When the switch S is closed, the generated blocking voltage Vblock charges the capacitor C, providing a voltage bias to the gate of transistor 101 which will block a range of output voltages when the switch is opened.

Accordingly, by controlling the voltage Vblock, the input level above which blocking will occur can be controlled.

In this configuration, as shown in FIG. 1, the output voltage Vout cannot go above the drain voltage VDD and the blocking voltage Vblock can be used to further control an input level above which blocking will occur. Further, Vout will not track the input when Vinput>(VDD+Vgs−Vblock), where Vgs is the voltage between the gate and source of the transistor 101, assuming the switch S is opened when Vinput is at 0V. By setting Vblock to an appropriate voltage level and controlling when the switch S is opened, a range of input voltages which will track to the output VOUT can be set. Accordingly, the bridging interface allows an electronic device, having a smaller voltage domain, to safely interface with an input signal or other electronic device having a larger voltage domain.

For example, a core device, which includes the bridging interface, may have a system supply voltage of 1.8v, which can be used as the voltage sources providing VDD, and a threshold voltage of the transistor 101 of the bridging interface may be 500 mV. If, for example, the input voltage Vinput is an AC voltage input and Vinput is at 0V when the switch is opened, it is desirable to block all positive AC signals at Vinput and the maximum output voltage Vout should not to exceed VDD−0.2V, then the gate of the transistor 101 should be sitting at VDD−0.2V+0.5V=VDD+0.3V=1.8V+ 0.3V=2.1V. That is, the blocking voltage Vblock should provide a voltage bias at the gate of the transistor 101 equal to 2.1 volts. Because the transistor is configured as a source follower, with a constant bias current, the output voltage Vout will track the input voltage Vinput with a constant offset, Vgs. In this exemplary circuit, because VDD is provided at the drain of the transistor 101, any output voltage above VDD will be clipped. Furthermore, the blocking voltage Vblock allows for the bridging interface 100 to block a range of voltage inputs. In this exemplary circuit, the blocking voltage Vblock blocks any positive AC voltage received at the gate of transistor 101.

Figure 2:
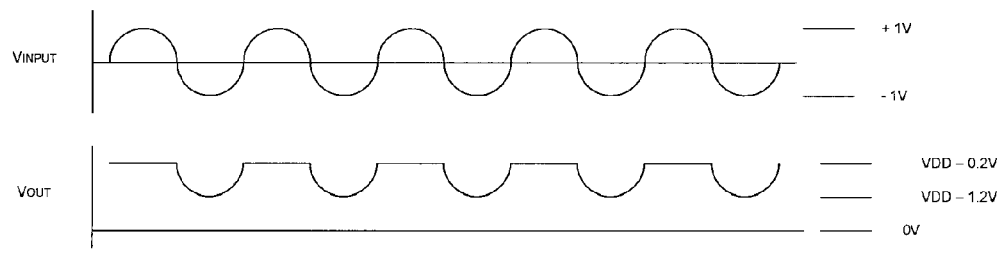
FIG. 2 illustrates an exemplary comparison between the voltage input to a transistor and the voltage output by the transistor in accordance with an exemplary embodiment of the present invention.

FIG. 2 illustrates an input voltage signal Vinput and a corresponding output voltage signal Vout of the exemplary circuit discussed above. As seen in FIG. 2, the input voltage signal Vinput is an AC signal, which has a peak voltage of 1V. Because the transistor 101 is configured as a source follower, the output signal will try to follow the input signal minus the offset, Vgs. In the above example, the controller outputs a Vblock to place a 2.1V bias on the gate of the transistor 101. Accordingly, as seen in FIG. 2, the maximum voltage output of Vout is 1.6V (i.e., VDD minus an offset voltage of 0.2V), and because there is a 2.1V bias on the gate of the transistor, the output voltage Vout only tracks the input voltage Vinput when Vinput is a negative voltage pulse. That is, output voltage Vout only tracks the input voltage Vinput when a negative voltage pulse on Vinput causes the voltage at the gate of transistor 101 to fall below 2.1V. Accordingly, the bridging interface 100 provides a clipping function, blocking any voltage output Vout above a desired voltage, here 1.6V, and further provides a function of blocking a range of input voltages, in this exemplary circuit, any positive AC input voltage. The offset voltage may correspond to a saturation voltage Vdsat, and may be used to offset the voltage output from transistor 101 to help the output of the transistor stay in a saturation region.

In the example discussed above, Vblock was selected to block any positive voltage input signal on Vinput. However, Vblock can be selected to block any range of voltages, positive or negative.

Because the blocking voltage Vblock may need to exceed the voltage of the system supply voltage, when certain input voltage ranges are desired to be blocked, the voltage source supplying Vblock may be a separate, larger voltage supply than the system supply voltage.

Figure 3:
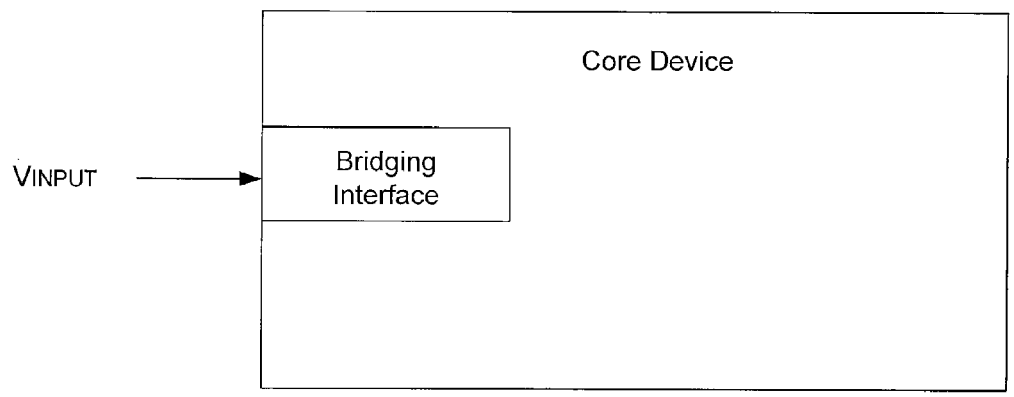
FIG. 3 illustrates an exemplary core device according to one aspect of the present invention.

The input voltage Vinput can be received, for example, from an input pin external to a core device as seen, for example, in FIG. 3. As seen in FIG. 3, the bridging interface receives an input from an external source, which may have a higher voltage swing than the core device can tolerate, and provide a voltage to the core device within the tolerable range of the core device.

Figure 4:
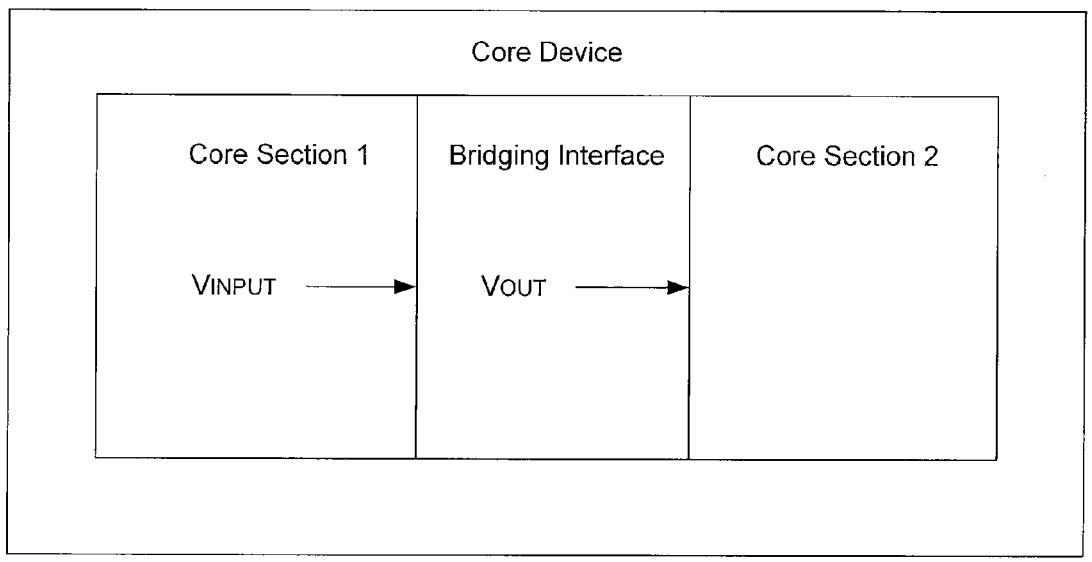
FIG. 4 illustrates another exemplary core device according to another aspect of the present invention.

Alternatively, if different sections of a core device have different voltage tolerances, the bridging interface can receiving a signal from one section of a core device and provide the voltage output to a second core section within the core device, as seen, for example, in FIG. 4. For example, if core section 1 can tolerate a voltage range of ±2.8 volts, but core section 2 can only tolerate a voltage range of ±1.8 volts, the bridging interface can pass an input from core section 1 to core section 2, while providing protection for core section 2 by blocking input voltages outside the section's voltage tolerance range.

Returning to FIG. 1, the source of the drain voltage VDD is irrelevant to the output, so long as the drain voltage VDD is provided at the appropriate voltage, within an acceptable tolerance range. As discussed above, the source of the drain voltage VDD may be the system supply voltage source of the core device. Likewise, source of the bias current Ibias is irrelevant, so long as the bias current Ibias is provided, within an acceptable tolerance range. The current source may be constructed from, for example, transistors.

The blocking voltage Vblock can be derived by a controller which can vary Vblock based upon the characteristics of the transistor 101 and a desired input voltage blocking range. For example, the controller can be designed to vary Vblock based upon the thermal characteristics of the transistor 101. That is, as the temperature of the transistor 101 changes, which would normally cause the output voltage Vout to change because temperature changes cause Vgs to change, the controller can vary Vblock such that the range of input voltages blocked by the bridging interface stays constant. Alternatively, if fluctuations due to temperature changes are governed so as to be irrelevant with respect to a specific core device and/or the range of input voltages to be blocked by Vblock is known and fixed, Vblock can be supplied by a fixed voltage source. The controller can also control Vblock correct for process variations during the manufacture of the circuit, which could effect the transistors Vgs. Further, the controller can be used to control Vblock based upon variations in a supply voltage, which could also affect the transistor's Vgs.

When the switch S is closed, the blocking voltage Vblock will cause a biasing voltage to be stored on the capacitor C. When the switch is opened, the output would block at VDD if the input voltage Vinput were to go too far above the level it was at when the switch was closed. Another benefit of the first embodiment is that when the input voltage Vinput has defined characteristics, and only certain parts of the input signal need to be blocked, the switch S can be opened and closed to only block an input voltage range on the desired part of the input signal.

Yet another benefit of the first embodiment is that the bridging interface will not draw current from the input node when the input voltage Vinput goes outside of the allowable range. Instead, because a source follower is used, the bridging interface is able to maintain a high input impedance for all input voltages while still blocking voltages outside the allowed range.

Figure 5:
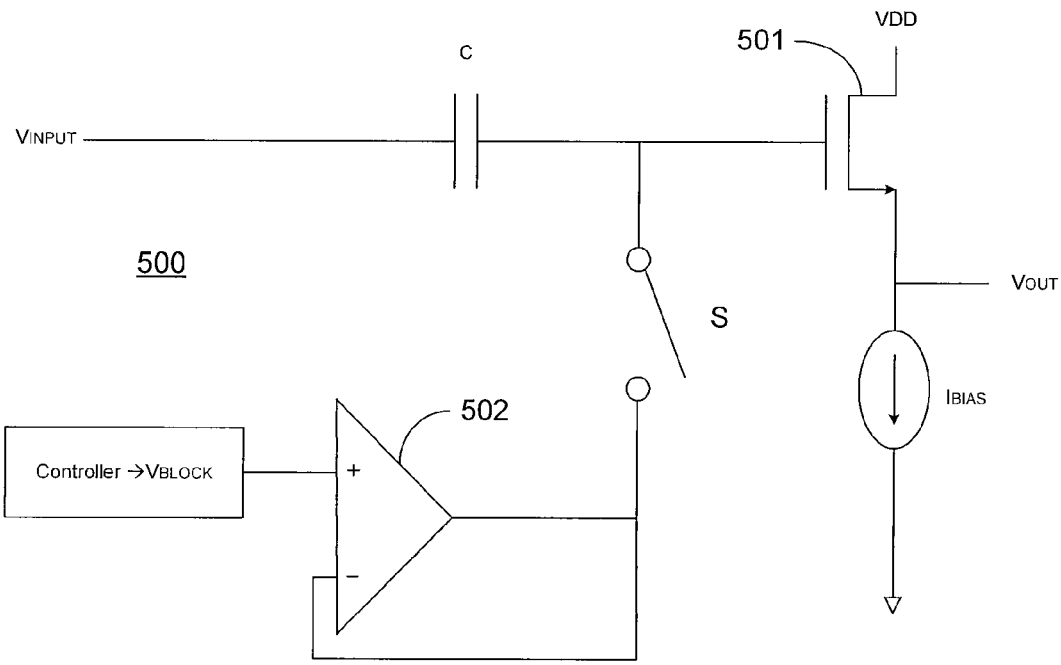
FIG. 5 illustrates another exemplary embodiment of a transistor with large-scale blocking characteristics.

FIG. 5 illustrates another embodiment of a bridging interface 500. FIG. 5 illustrates a transistor 501, having an input capacitor C and a switch S coupled to an input terminal of the transistor 501 and an amplifier 502 coupled to the switch. This embodiment is similar to the embodiment as seen in FIG. 1, except that the controller inputs the blocking voltage to buffer amplifier 502. The buffer amplifier 502 does not provide any voltage amplification, rather the buffer amplifier acts as an impedance transformer or a power amplifier. This embodiment is useful when the impedance of the controller circuitry is higher than the impedance of the bridging interface.

Figure 6:
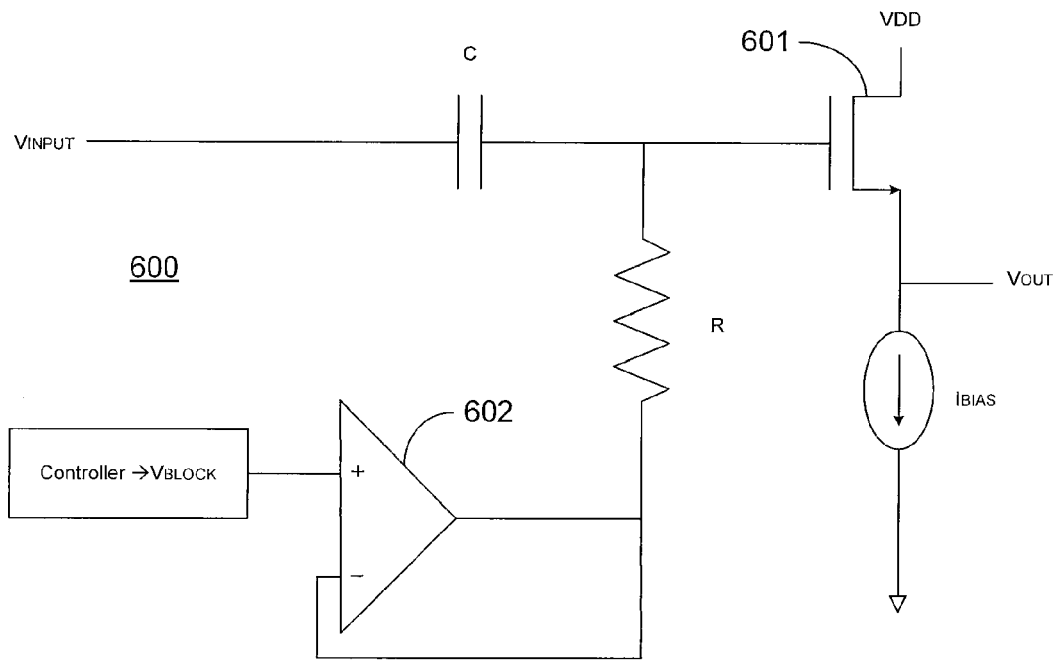
FIG. 6 illustrates yet another exemplary embodiment of a transistor with large-scale blocking characteristics.

FIG. 6 illustrates yet another embodiment of a bridging interface 600. FIG. 6 illustrates a transistor 601, having an input capacitor C and a resistor R coupled to an input terminal of the transistor 601 and an amplifier 602 coupled to the resistor R. This embodiment is similar to the embodiments seen in FIGS. 1 and 5, except that switch S is replaced with the resistor R, to provide the voltage bias to the input terminal of the transistor 101. However, in this embodiment, rather than operating the switch to time select which part of the input voltage Vinput will be blocked, the resistance of resistor R can be selected to change the frequency at which blocking can occur. That is, the resistance of resistor R can be selectively changed to determine which frequencies of the input voltage Vinput will be blocked. The resistor, in the configuration shown in FIG. 6, forms a high pass filter to block certain frequencies, however, other types of filters can be used. For example, a band pass filter or a low pass filter.

Figure 7A:
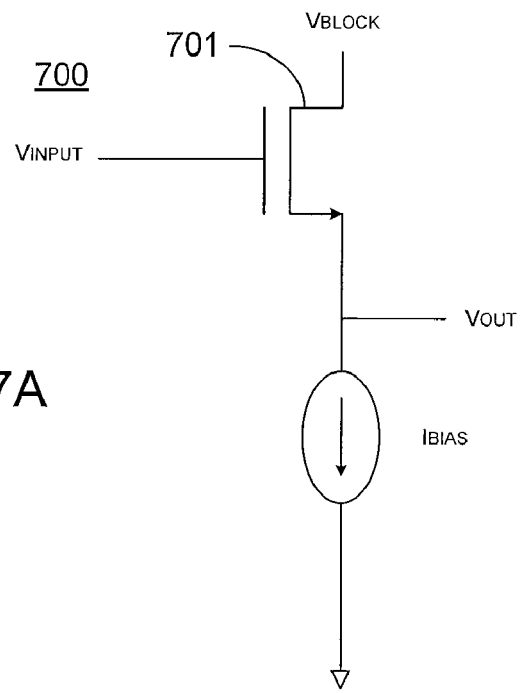
FIG. 7A illustrates a further exemplary embodiment of a transistor with large-scale blocking characteristics.

FIG. 7A illustrates a further embodiment of a bridging interface 700. FIG. 7A illustrates a transistor 701 configured as a source follower. The transistor 701 receives an input voltage Vinput and provides an output voltage Vout, which will try to follow the input voltage Vinput. A voltage source (not shown) provides a blocking voltage Vblock at a drain terminal of the transistor 701, and a current source Ibias is connected to a source terminal of the transistor 701.

The voltage source at the drain terminal provides an upper limit for the output voltage Vout of transistor 701, that is, the voltage Vblock present at the drain of the transistor 701 blocks any output voltage Vout that would exceed voltage Vblock. The current source Ibias establishes a predetermined current at the source terminal of transistor 701 to set an appropriate operating point.

In this embodiment, for any voltage at the input Vinput below (Vblock+Vgs−Vdsat) but above (Vgs+Vdsat), Vout would be equal to (Vinput−Vgs). Where Vgs is the voltage between the gate and source of the NMOS transistor 701, Vdsat is a saturation voltage equal to (Vgs−Vt), and Vt is a threshold voltage of transistor 701. In this embodiment, it is preferable to have Vblock lower than the system supply voltage of the core device in order to keep Vout from exceeding a certain level, for example, the peak voltage which the core device, or a section of a core device, can tolerate.

Figure 7B:
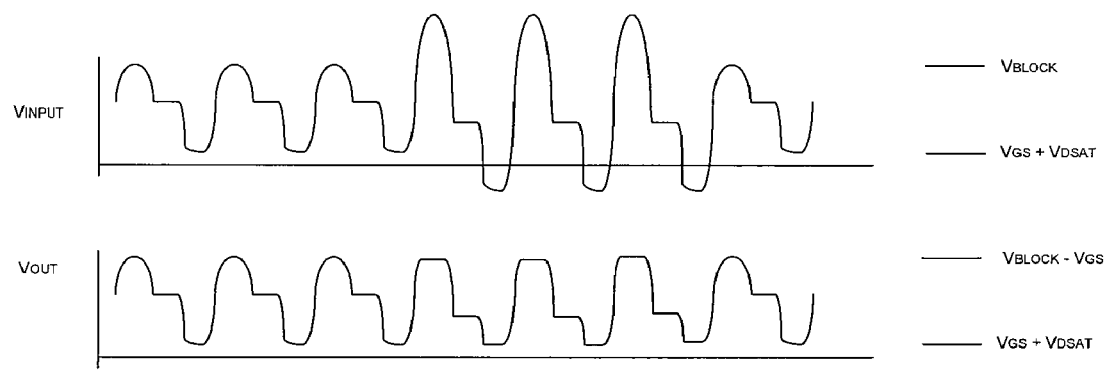
FIG. 7B illustrates an exemplary comparison between the voltage input to a transistor and the voltage output by the transistor in accordance with an exemplary embodiment of the present invention.

FIG. 7B illustrates a comparison between an exemplary input voltage Vinput and an output voltage Vout, in accordance with the embodiment as seen in FIG. 7A. As seen, for example, in FIG. 7B, the output voltage Vout follows the input voltage Vinput, when (Vgs+Vdsat)≦Vinput≦Vblock+Vgs−Vdsat.

Figure 8:
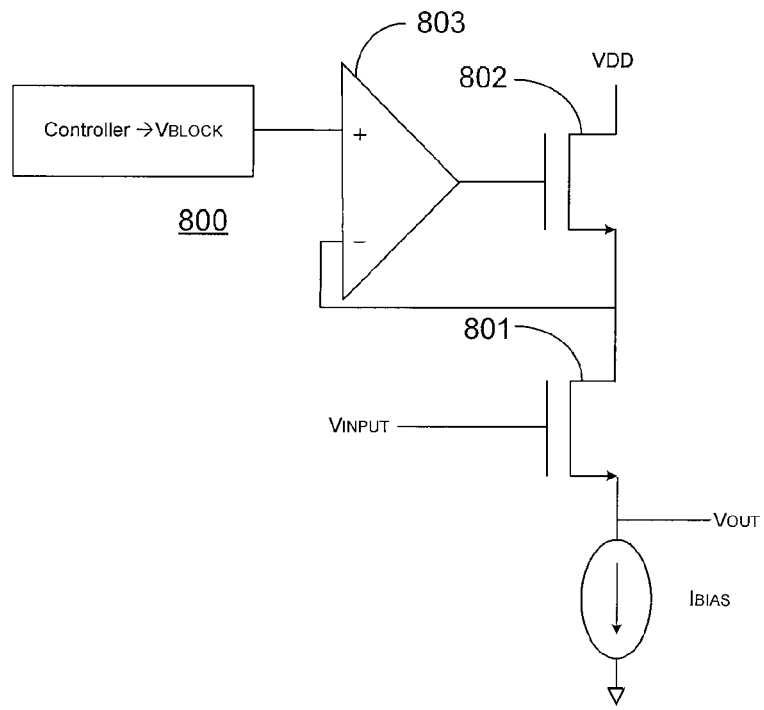
FIG. 8 illustrates yet another exemplary embodiment of a transistor with large-scale blocking characteristics.

FIG. 8 illustrates yet another embodiment of a bridging interface 800. FIG. 8 illustrates a transistor 801 configured as a source follower, having a current source Ibias connected to a source terminal of the transistor 801. The transistor 801 receives an input voltage Vinput and provides an output voltage Vout, which will try to follow the input voltage Vinput. The drain of transistor 801 is connected to a source terminal of a transistor 802. Transistor 802 receives a blocking voltage Vblock+Vgs, from an amplifier 803, at a gate of transistor 802 and receives a drain voltage VDD from a voltage source. The drain voltage VDD may be provided, for example, from a system voltage source of a core device.

In this embodiment, blocking voltage Vblock is preferably controlled such that an output of the amplifier 803 is above a threshold voltage of transistor 802 and below a system voltage source of a core device. Accordingly, the source of transistor 802 will provide a voltage below VDD to the drain of transistor 801, and, thus, the output voltage Vout will be clipped above the voltage provided to the drain of transistor 801, based on the blocking voltage Vblock, received at the gate of transistor 802. That is, in this embodiment the output voltage Vout will follow the input voltage Vinput, when Vt+Vdsat≦Vinput≦Vblock+Vgs−Vdsat, where Vt is the threshold voltage of transistor 801.

Figure 9:
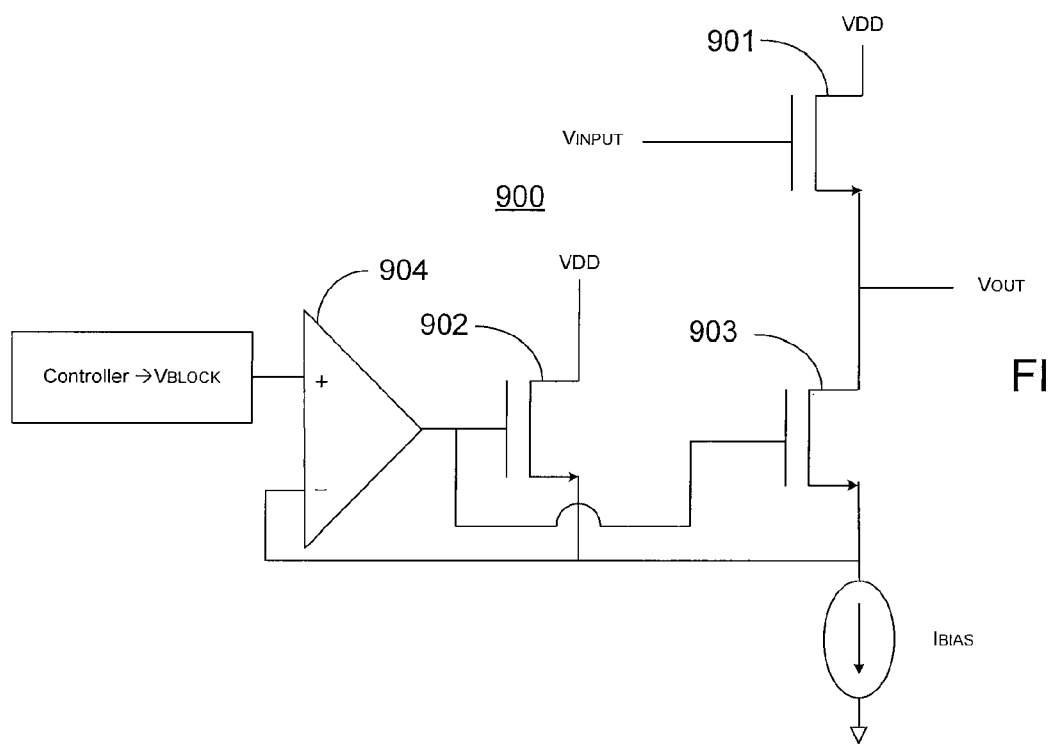
FIG. 9 illustrates yet another exemplary embodiment of a transistor with large-scale blocking characteristics.

FIG. 9 illustrates yet another embodiment of a bridging interface 900. FIG. 9 illustrates a transistor 901 configured as a source follower. The transistor 901 receives an input voltage Vinput and provides an output voltage Vout, which will try to follow the input voltage Vinput. The drain of transistor 901 is connected to a voltage source providing a drain voltage VDD. The source of transistor 901 is connected to a drain terminal of transistor 903 and a source terminal of transistor 903 is connected to a current source Ibias, which is couple to ground. The source of transistor 903 is also connected to a source terminal of a transistor 902, which has a drain terminal connected to Vdd. Transistors 902 and 903 both receive a blocking voltage Vblock, from an amplifier 903, at a gate of the respective transistors.

In this embodiment the thresholds of transistor 902 is preferably larger than the threshold of transistor 903, which can be accomplished, for example, by varying the size of the transistors. If Vout is above the Vblock, transistor 903 will have a positive Vds, which means that the transistor 903 will be "on" and all of the current from the current source Ibias will flow through transistor 903 and bias the source follower device, i.e., transistor 901. However, if the input voltage Vinput drops to low and the output voltage Vout tries to go below Vblock, then transistor 903 will have a 0V or negative Vds and will shut off. When transistor 903 shuts off, the current from the current source Ibias will flow through transistor 902 to VDD.

In this configuration, the blocking voltage Vblock will prevent the output voltage Vout from going below the blocking voltage Vblock, and the drain voltage VDD and the drain terminal of transistor 101 will clip any input voltage Vinput over VDD. Accordingly, in this embodiment the output voltage Vout will follow the input voltage Vinput, when Vblock≦Vinput≦VDD.

Figure 10:
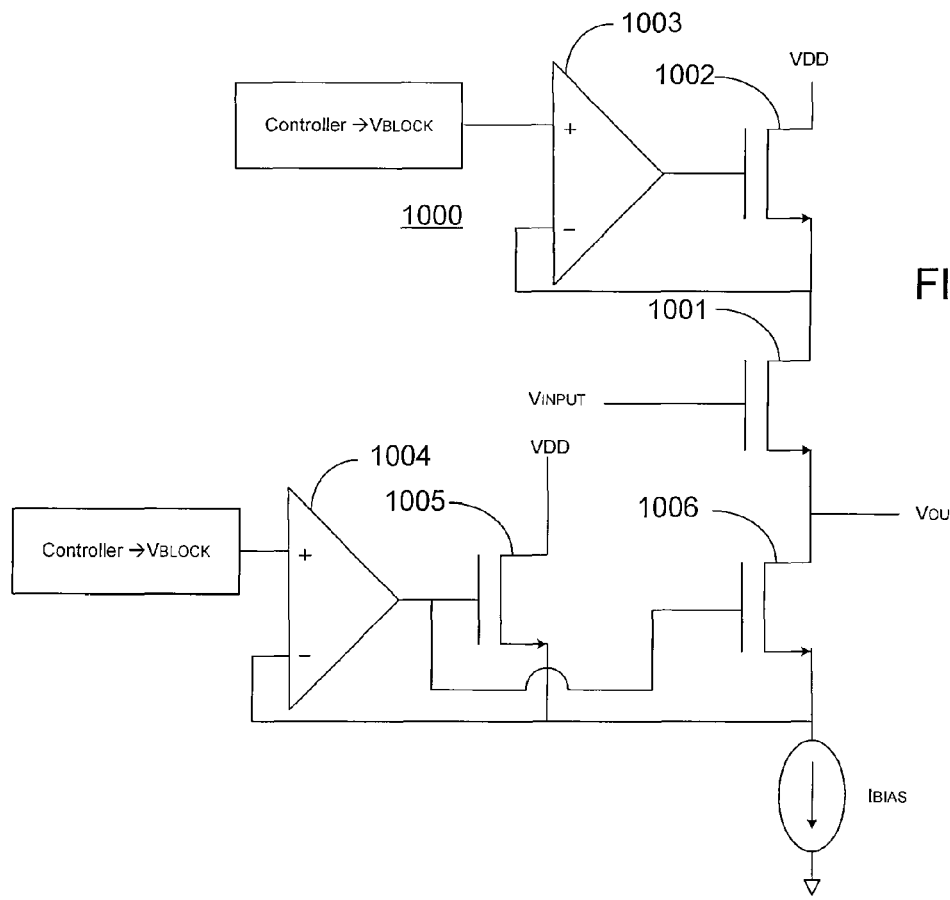
FIG. 10 illustrates yet another exemplary embodiment of a transistor with large-scale blocking characteristics.

FIG. 10 illustrates yet another embodiment of a bridging interface 1000. FIG. 10 illustrates a transistor 1001 configured as a source follower. The transistor 1001 receives an input voltage Vinput and provides an output voltage Vout, which will try to follow the input voltage Vinput. The drain of transistor 1001 is connected to a source terminal of a transistor 1002. Transistor 1002 receives a first blocking voltage Vblock, from an amplifier 1003, at a gate of transistor 1002 and receives a drain voltage VDD from a voltage source. The drain voltage VDD may be provided, for example, from a system voltage source of a core device. The source of transistor 1001 is connected to a drain terminal of transistor 1006 and a source terminal of transistor 1006 is connected to a current source Ibias, which is couple to ground. The source of transistor 1006 is also connected to a source terminal of a transistor 1005, which has a drain terminal connected to Vdd. Transistors 1006 and 1005 both receive a blocking voltage Vblock, from an amplifier 1004, at a gate of the respective transistors.

In this embodiment, the first blocking voltage Vblock is preferably controlled such that an output of the amplifier 1003 is above a threshold voltage of transistor 1002 and below a system voltage source of a core device. Accordingly, the source of transistor 1002 will provide a voltage below VDD to the drain of transistor 1001, and, thus, the output voltage Vout will be prevented from going above the voltage provided to the drain of transistor 1001, based on the first blocking voltage Vblock received at the gate of transistor 1002.

Further, in this embodiment the second blocking voltage Vblock is preferably selected prevent the output voltage Vout from going below the second blocking voltage Vblock.

That is, in this embodiment the output voltage Vout will follow the input voltage Vinput, when Vblock (2nd) ≦Vinput≦Vblock (1st).

Figure 11:
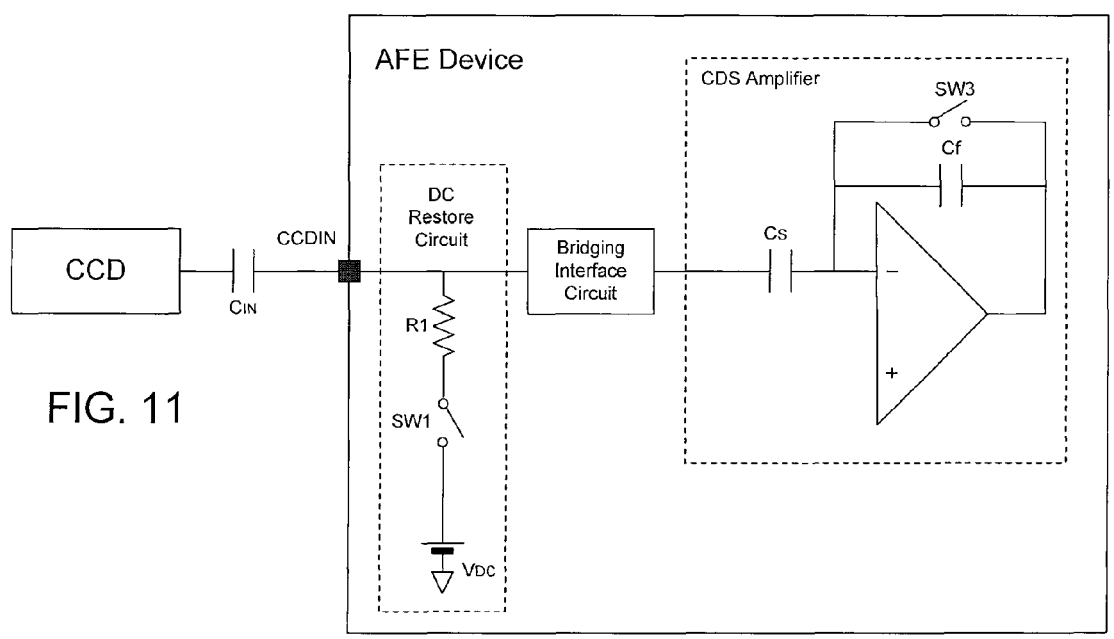
FIG. 11 illustrates an exemplary core device using a bridging interface circuit.

FIG. 11 illustrates an exemplary core device using a bridging interface circuit. FIG. 11 illustrates an analog front end (AFE) device acquiring a charged coupled device (CCD)

signal. A CCD is an analog shift register, which enables analog signals to be transported through successive stages, controlled by a clock.

Figure 12A:
FIG. 12A illustrates an exemplary CCD signal.

FIG. 12(a) illustrates an exemplary CCD signal, having a 7 volt swing. As seen in FIG. 12, the CCD signal may have three components; a reset gate feed thru mode, a reset mode and a date mode. The AFE device may, for example, only be able to tolerate voltages up to 1.8V. Accordingly, if the CCD signal, with the 7V swing was passed directly to the AFE device, the AFE device could be damage. The large reset gate feed though signal, as seen in FIG. 12, may also cause parasitic diodes to turn on and draw current from the input, which can cause reliability problems as well as change the DC voltage on the external coupling capacitor, Cin.

Figure 12B:
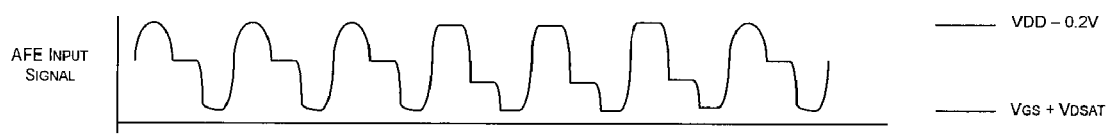
FIG. 12B illustrates the exemplary CCD signal after passing through a bridging interface to be provided to as an input to an AFE device.

FIG. 12(b) illustrates the CCD signal after passing through a bridging interface according to one embodiment of the present invention. As seen in FIG. 12(b), the AFE input signal was blocked from going above a certain value, in this case, VDD−2V, thereby protecting the AFE device from damage and improving the AFE devices reliability. Furthermore, if the bridging interface uses a switch, for example, switch S as seen in FIG. 1, and if the AFE device is only interested in the data component of the CCD signal, the switch can be used to reject the reset gate feed thru mode signal and the reset mode signal. That is, the blocking voltage Vblock can be adjusted to block the range of voltages corresponding to the reset gate feed thru mode and the reset mode.

Several embodiments of the invention are specifically illustrated and/or described herein. However, it will be appreciated that modifications and variations of the invention are covered by the above teachings and within the purview of the appended claims without departing from the spirit and intended scope of the invention.

We claim:

1. An interface circuit for use between components using different voltage domains, comprising:
    a transistor receiving an input voltage and providing an output voltage;
    a voltage source, proving a clipping voltage to a terminal of the transistor, preventing the output voltage of the transistor from rising above the clipping voltage;
    a capacitor connected between the input voltage and a input terminal of the transistor; and
    a blocking voltage source, selectively connected between the capacitor and the input of the transistor, blocking a range of voltages input by the input voltage,
    wherein the interface circuit receives the input voltage from a charged coupled device (CCD) and the output voltage is provided to an analog front end device (AFE).

2. The interface of claim 1, further comprising: a switch selectively connecting the blocking voltage source to the input terminal of the transistor.

3. The interface of claim 2, further comprising: a switch controller, controlling the switch, wherein when the switch is opened, the blocking voltage blocks a range of voltages input by the input voltage.

4. The interface of claim 1, further comprising: a controller controlling a voltage supplied by the blocking voltage source based upon the characteristics of the transistor.

5. The interface of claim 4, wherein the controller controls the voltage supplied by the blocking voltage based upon a temperature of the transistor.

6. The interface of claim 1, wherein the transistor is a NMOS transistor, the clipping voltage is provided to a drain terminal of the NMOS transistor, and the blocking voltage is provided to a gate of the NMOS transistor.

7. The interface of claim 1, further wherein the transistor is configured as a source follower.

8. An interface circuit for use between components using different voltage domains, comprising:
    a transistor receiving an input voltage signal and providing an output voltage;
    a voltage source, proving a clipping voltage to a terminal of the transistor, preventing the output voltage of the transistor from rising above the clipping voltage;
    a capacitor connected between the input voltage and a input terminal of the transistor; and
    a blocking voltage source, connected between the capacitor and the input of the transistor through a resistor, blocking a selected frequency range of the input voltage signal, wherein the interface circuit receives the input voltage from a charged coupled device (CCD) and the output voltage is provided to an analog front end device (AFE).

9. An interface circuit for use between components using different voltage domains, comprising:
    a first transistor receiving an input voltage and providing an output voltage;
    a voltage source, producing a first blocking voltage;
    a second transistor, receiving said first blocking voltage from said voltage source at an input terminal of the second transistor, and providing said first blocking voltage to a terminal of the first transistor, blocking the output voltage of the first transistor from rising above the first blocking voltage,
    wherein the first blocking voltage is lower than a supply voltage of said components; and
    a second voltage source, producing a second blocking voltage; and
    a third transistor, receiving said second blocking voltage at an input terminal of the second transistor, and providing said second blocking voltage to the output terminal of the first transistor, blocking the output voltage of the first transistor from going below the second blocking voltage.

10. The interface of claim 9, further comprising: a controller controlling the first blocking voltage produced by the voltage source based upon the characteristics of the transistor.

* * * * *

UNITED STATES PATENT AND TRADEMARK OFFICE
CERTIFICATE OF CORRECTION

PATENT NO. : 8,008,962 B2
APPLICATION NO. : 12/467437
DATED : August 30, 2011
INVENTOR(S) : Ronald A. Kapusta, Jr. et al.

It is certified that error appears in the above-identified patent and that said Letters Patent is hereby corrected as shown below:

Title Page:

In line 6 of the Abstract (57), change "source follow" to -- source follower --

In the Specification:

In column 1, line 3, add -- Cross-References to Related Applications:

This application is a non-provisional and claims priority from U.S. Provisional No. 61/085,710, filed August 1, 2008. --

In column 3, lines 3-4, change "should not to exceed" to -- should not exceed --

In the Claims:

In column 7, line 39, change "proving" to -- providing --

In column 7, line 50, change "The interface" to -- The interface circuit --

In column 7, line 53, change "The interface" to -- The interface circuit --

In column 8, line 1, change "The interface" to -- The interface circuit --

In column 8, line 4, change "The interface" to -- The interface circuit --

In column 8, line 7, change "The interface" to -- The interface circuit --

In column 8, line 11, change "The interface" to -- The interface circuit --

Signed and Sealed this
Thirteenth Day of August, 2013

Teresa Stanek Rea
*Acting Director of the United States Patent and Trademark Office*

In column 8, line 18, change "proving" to -- providing --

In column 8, line 50, change "The interface" to -- The interface circuit --